United States Patent
Peter

(10) Patent No.: US 6,850,412 B2
(45) Date of Patent: Feb. 1, 2005

(54) HOUSING FOR AN ELECTRONIC MONITORING DEVICE ON A VEHICLE PART

(75) Inventor: Cornelius Peter, Bühl (DE)

(73) Assignee: TRW Automotive Electronics & Components GmbH & Co. KG, Radolfzell (DE)

(*) Notice: Subject to any disclaimer, the term of this patent is extended or adjusted under 35 U.S.C. 154(b) by 0 days.

(21) Appl. No.: 09/998,105

(22) Filed: Nov. 30, 2001

(65) Prior Publication Data

US 2002/0088275 A1 Jul. 11, 2002

(30) Foreign Application Priority Data

Dec. 1, 2000 (DE) .......................................... 200 20 392

(51) Int. Cl.[7] .............................................. H05K 1/14
(52) U.S. Cl. ...................... 361/736; 361/800; 361/724; 361/816; 361/752; 439/504; 174/35 C
(58) Field of Search ................................. 361/736, 752, 361/714, 724, 816, 800, 730; 257/99; 439/504; 174/35 C

(56) References Cited

U.S. PATENT DOCUMENTS

| | | | | |
|---|---|---|---|---|
| 4,510,677 A | * | 4/1985 | Collumeau | 29/825 |
| 4,518,982 A | * | 5/1985 | Du Bois et al. | 257/796 |
| 4,782,240 A | * | 11/1988 | Davidson | 307/10.7 |
| 4,924,152 A | * | 5/1990 | Flickinger | 315/363 |
| 5,872,332 A | * | 2/1999 | Verma | 174/35 C |
| 6,347,958 B1 | * | 2/2002 | Tsai | 439/488 |

FOREIGN PATENT DOCUMENTS

| | | |
|---|---|---|
| DE | 8816054 U1 | 9/1989 |
| DE | 4329083 A1 | 3/1995 |
| DE | 9420980 U1 | 4/1995 |
| DE | 29506697 U1 | 8/1995 |
| DE | 4437664 A1 | 4/1996 |
| DE | 19834740 A1 | 2/2000 |

* cited by examiner

*Primary Examiner*—Kamand Cuneo
*Assistant Examiner*—Hung S. Bui
(74) *Attorney, Agent, or Firm*—Tarolli, Sundheim, Covell & Tummino L.L.P.

(57) ABSTRACT

A housing for an electronic monitoring device on a vehicle part such as a lead accumulator comprises a metallic, load-bearing baseplate and an injection molded, generally parallelepipedal housing body encapsulating the baseplate. The baseplate projects out of the housing body on at least one side with a cantilevered attachment section.

13 Claims, 2 Drawing Sheets

HOUSING FOR AN ELECTRONIC MONITORING DEVICE ON A VEHICLE PART

FIELD OF THE INVENTION

The invention relates to a housing for an electronic monitoring device on a vehicle part such as a lead accumulator comprising a metallic, load-bearing baseplate and an injection molded, generally parallelepipedal housing body encapsulating the base-plate.

BACKGROUND OF THE INVENTION

Conventional housings for electronic monitoring devices on vehicle parts are normally made of metal or plastic. Metal housings have a baseplate with which they can be attached to the vehicle part. Housings made of plastic can be provided with shaped-on tabs or flanges for purposes of attachment.

BRIEF SUMMARY OF THE INVENTION

The invention provides a housing for an electronic monitoring device on a vehicle part such as a lead accumulator that can be made inexpensively by means of mass production and that meets all mechanical and electrical requirements. The housing according to the invention has a metallic load-bearing baseplate and an injection molded generally parallelepipedal housing body encapsulating the baseplate. The baseplate projects out of the housing body on at least one side with a cantilevered attachment section. The housing is especially suited to receive an electrical charge status indicator for lead-acid batteries. Due to the cantilevered attachment section, a direct attachment to a suitably configured cell terminal is possible. Cell terminals are known onto which relatively thick electric cables are connected to upright stud bolts. When the attachment section is provided with appropriate attachment openings, it can be attached directly to the stud bolts of the cell terminal. Then the attachment section simultaneously serves to establish the electric connection, especially with the positive battery terminal.

In the preferred embodiment, the baseplate is stamped from sheet metal, together with one or more contact plates. Here, the baseplate and the contact plates are held together by an outer holding frame that is removed from the outside of the shaped housing body after the baseplate has been encapsulated.

Preferably, the baseplate and the contact plate are also connected with stamped-out soldering pins that are perpendicularly bent upwards and that are intended to penetrate into corresponding openings of a printed circuit board on which the electronic system of the device is mounted. Each contact plate preferably has a contact tag that projects out of the housing body after encapsulation and that is surrounded by a protective sleeve integrally molded with the housing body.

BRIEF DESCRIPTION OF THE DRAWINGS

Additional features and advantages of the invention ensue from the following description of a preferred embodiment and from the appended drawings to which reference is made. The drawings show the following.

DETAILED DESCRIPTION OF THE INVENTION

Figure 1:
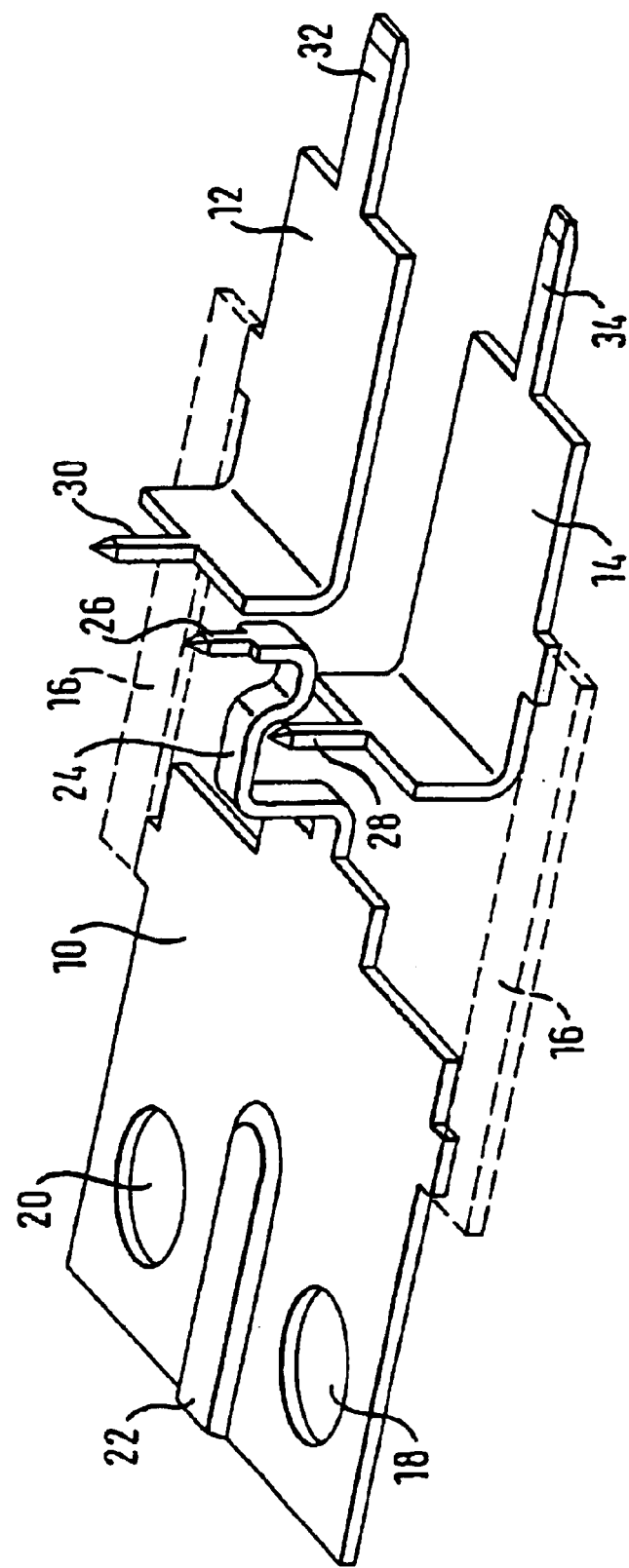
FIG. 1—a perspective view of a baseplate and two contact plates that are stamped from one piece of sheet metal together and are connected by an outer holding frame.

The structures shown in FIG. 1 are stamped from a piece of sheet metal. These structures include a baseplate 10 and two contact plates 12, 14 that are connected to the baseplate 10 on laterally projecting tabs by means of holding strips 16. These holding strips 16 form an outer holding frame by means of which the baseplate 10 is held in one plane with the contact plates 12, 14 so that it can be laid into an injection-molding tool.

The baseplate 10 has two circular stamped-out attachment openings 18, 20 and an embossed reinforcement bead 22. Furthermore, together with the baseplate 10, a contact tag 24 is stamped out whose free end is configured as a soldering pin 26 that stands upright perpendicular to the baseplate 10. The contact tag 24 consists of two U-shaped sections that face in opposite directions and that hold the soldering pin 26 in the desired raised position. The U-shaped section facing away from the baseplate 10 forms a contact surface that is designed to make heat-conducting contact with a temperature sensor element mounted on a printed circuit board located above it. Therefore, via the contact tag 24, heat conduction from the positive pole of a lead accumulator to the temperature sensor element via the baseplate 10 is ensured.

On each contact plate 12, 14, an inner end is bent perpendicularly and it holds a perpendicularly upright soldering pin 28, 30. The soldering pins 26, 28, 30 are arranged at the same height and are intended to penetrate into corresponding openings of a printed circuit board on which the electronic monitoring device is mounted, which is preferably a charge status indicator for a lead accumulator. Each contact plate 12, 14 also has a contact tag 32, 34 projecting towards the outside.

Figure 2:
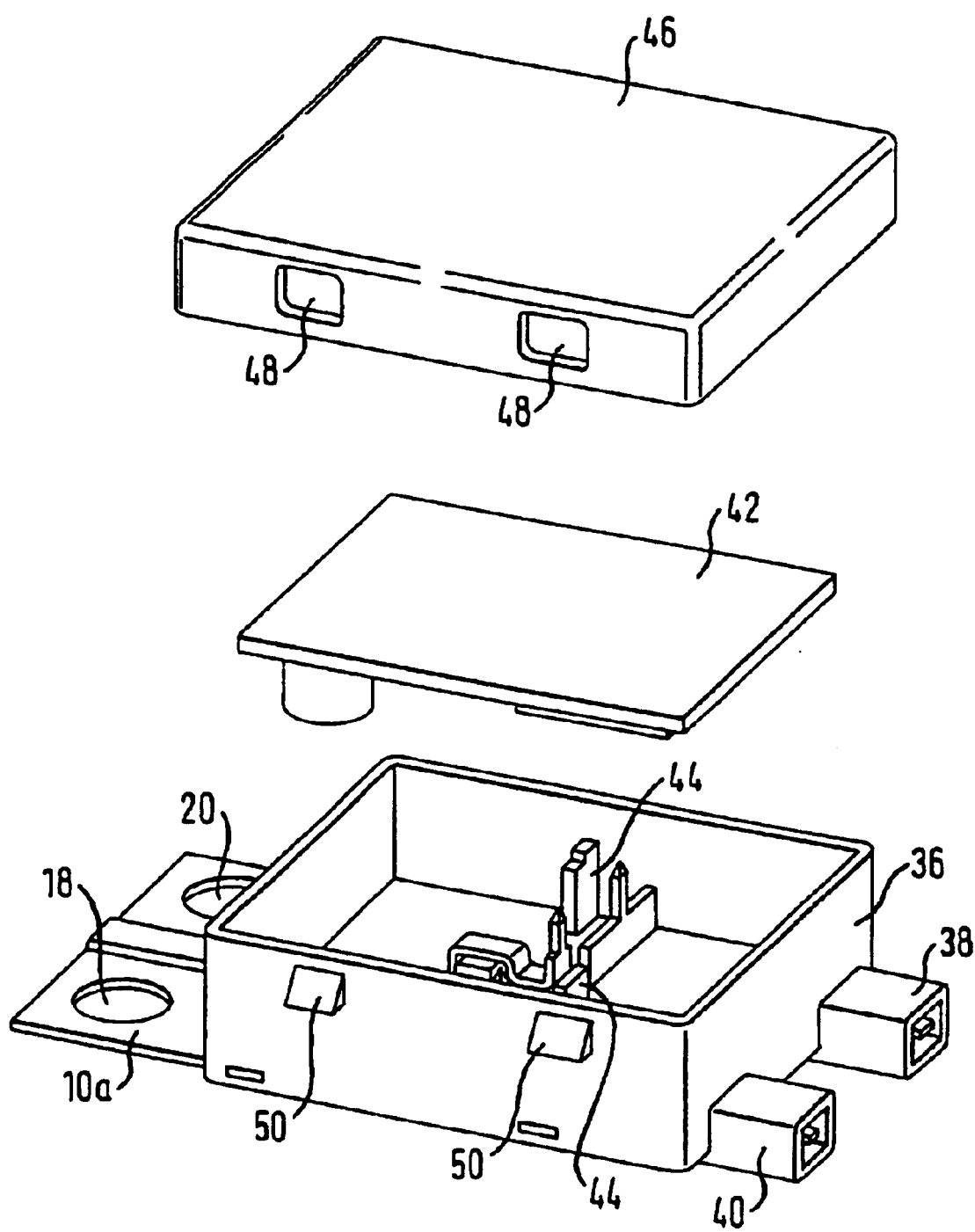
FIG. 2—an exploded view of an electronic monitoring device with the housing according to the invention.

FIG. 2 shows a parallelepipedal housing body 36 made of plastic that was produced by encapsulating the baseplate 10 and the contact plates 12, 14 with a suitable plastic injection-molding compound. The holding strips 16 (FIG. 1) of the outer holding frame have been removed so that the electrical connection between the baseplate 10 and the contact plates 12, 14 is absent. The part 10a of the baseplate 10 that forms a cantilevered attachment section projects outwards on one of the narrow sides of the housing body 36. The contact tags 32, 34 of the contact plates 12, 14 project outwards on the opposite narrow side. Each contact plate is surrounded by a protective sleeve 38, 40 integrally molded with housing body 36. The contact tags 32, 34 as such are suitable to directly slide matching plug shoes onto them. The attachment part 10a of the baseplate 10, which projects out of the housing body 36, is where the cantilevered attachment of the entire device to a positive cell terminal of a lead accumulator takes place, whereby the latter is provided with two stud bolts that then project through the attachment openings 18, 20 of the baseplate 10.

The reference numeral 42 in FIG. 2 designates a printed circuit board on which the electronic device is mounted. The printed circuit board 42 has passages for the soldering pins 26, 28 and 30. The housing body 36 comprises integrally molded support structures 44 for the printed circuit board 42.

The side of the parallelepipedal housing body 36 has an open side opposite the baseplate 10 and a removable cover 46 fits on the open side of the housing body 36. The cover 46 has lock-in openings 48 that interact with the molded-on support projections 50 on the housing body 36 in order to keep the positioned cover 46 connected to the housing body 36.

What is claimed is:

1. A housing for an electronic monitoring device on a vehicle part such as a lead accumulator, said housing comprising:
   a) a metallic load-bearing base plate;
   b) an injection molded generally parallelepipedal housing body formed on and partially surrounding said base plate including on a side and bottom surface of the base plate;
   said base plate projecting out of said housing body on at least one side, thus forming a cantilevered attachment section.

2. The housing according to claim 1, wherein said base plate is stamped from sheet metal.

3. The housing according to claim 2, wherein at least one contact plate is stamped from said sheet metal with at least one contact tag projecting out of said housing body after encapsulation.

4. The housing according to claim 3, wherein said contact tag is surrounded by a protective sleeve integrally molded with said housing body.

5. The housing according to claim 1, wherein said housing body comprises integrally molded internal support structures for a printed circuit board.

6. The housing according to claim 1, wherein said housing body has an open side opposite said base plate and a removable cover, said cover fitting on the open side of said housing body and being connected to said housing body by an interaction of lock-in openings and corresponding support projections.

7. The housing according to claim 1, wherein said attachment section of said base plate has at least one embossed reinforcement bead.

8. The housing according to claim 1, wherein said attachment section has at least one attachment hole for the passage of a stud which is attached to a cell terminal of a lead accumulator.

9. An electronic monitoring device on a vehicle part such as a lead accumulator, said device comprising:
   a housing with a metallic load-bearing base plate and an injection molded, generally parallelepipedal housing body formed on and partially surrounding said base plate including on a side and bottom surface of the base plate,
   a printed circuit board, and
   at least one soldering pin being stamped out from said base plate,
   said soldering pin being perpendicularly bent upwards inside said housing body, said soldering pin penetrating into a corresponding opening of said printed circuit board to contact said printed circuit board.

10. A housing for an electronic monitoring device on a vehicle part such as a lead accumulator, said housing comprising:
   a) a metallic load-bearing base plate;
   b) an injection molded generally parallelepipedal housing body formed on and partially surrounding said base plate including on a side and bottom surface of the base plate;
   said base plate projecting out of said housing body on at least one side, thus forming a cantilevered attachment section,
   wherein at least one soldering pin is stamped out from said base plate, said soldering pin being perpendicularly bent upwards inside said housing body.

11. A housing for an electronic monitoring device on a vehicle part such as a lead accumulator, said housing comprising:
   a) a metallic load-bearing base plate;
   b) an injection molded generally parallelepipedal housing body formed on and partially surrounding said base plate including on a side and bottom surface of the base plate;
   said base plate projecting out of said housing body on at least one side, thus forming a cantilevered attachment section,
   wherein said base plate is stamped from sheet metal;
   wherein at least one contact plate is stamped from said sheet metal with at least one contact tag projecting out of said housing body after encapsulation;
   wherein at least one soldering pin is stamped out from said contact plate, said soldering pin being perpendicularly bent upwards inside said housing body.

12. A housing for an electronic monitoring device on a vehicle part such as a lead accumulator, said housing comprising:
   a) a metallic load-bearing base plate;
   b) an injection molded generally parallelepipedal housing body formed on and partially surrounding said base plate including on a side and bottom surface of the base plate;
   said base plate projecting out of said housing body on at least one side, thus forming a cantilevered attachment section.
   wherein said base plate has a contact tag that is bent upwards and that forms a contact surface for a temperature sensor element mounted on a printed circuit board.

13. An electronic monitoring device on a vehicle part such as a lead accumulator, said device comprising:
   a metallic load-bearing base plate,
   an injection molded, generally parallelepipedal housing body made of an electrically non-conductive material formed on and partially surrounding said base plate including on a side and bottom surface of the base plate, and
   a printed circuit board in said housing,
   said base plate including a portion for electrical communication with said circuit board,
   said base plate including a cantilever attachment section projecting out of said housing body on at least one side for attachment to said vehicle part.

* * * * *